US010686031B2

(12) United States Patent
Feng et al.

(10) Patent No.: US 10,686,031 B2
(45) Date of Patent: Jun. 16, 2020

(54) FINGER METAL-OXIDE-METAL (FMOM) CAPACITOR

(71) Applicant: QUALCOMM Incorporated, San Diego, CA (US)

(72) Inventors: Peijie Feng, San Diego, CA (US); Junjing Bao, San Diego, CA (US); Ye Lu, San Diego, CA (US); Giridhar Nallapati, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/937,097

(22) Filed: Mar. 27, 2018

(65) Prior Publication Data

US 2019/0305077 A1  Oct. 3, 2019

(51) Int. Cl.
*H01L 49/02* (2006.01)
*H01L 23/522* (2006.01)

(52) U.S. Cl.
CPC .......... *H01L 28/88* (2013.01); *H01L 23/5223* (2013.01); *H01L 23/5226* (2013.01)

(58) Field of Classification Search
CPC .. H01L 28/88; H01L 23/5226; H01L 23/5223
See application file for complete search history.

(56) References Cited

U.S. PATENT DOCUMENTS

| 5,583,359 | A  | * | 12/1996 | Ng ....................... H01L 23/5223 257/306 |
| 6,542,351 | B1 | * | 4/2003  | Kwang ............... H01L 23/5223 257/E21.012 |
| 6,737,698 | B1 | * | 5/2004  | Paul .................... H01L 23/5223 257/306 |
| 6,999,297 | B1 |   | 2/2006  | Klee et al. |
| 8,836,079 | B2 |   | 9/2014  | Li et al. |
| 9,269,492 | B2 |   | 2/2016  | Zhu et al. |
| 9,508,788 | B2 | * | 11/2016 | Roehner ................. H01L 28/20 |
| 9,761,655 | B1 |   | 9/2017  | Ando et al. |
| 2005/0135042 | A1 | * | 6/2005 | Chiu-Kit Fong ... H01L 23/5223 361/303 |

(Continued)

*Primary Examiner* — Mohammad M Hoque
(74) *Attorney, Agent, or Firm* — Qualcomm Incorporated/Seyfarth Shawn LLP

(57) ABSTRACT

A capacitor includes first conductive fingers interdigitated with second conductive fingers at an Mx interconnect level, and third conductive fingers interdigitated with fourth conductive fingers at an Mx-1 interconnect level. The third conductive fingers are offset from the first conductive fingers. The second conductive fingers are offset from the fourth conductive fingers. The capacitor further includes fifth conductive fingers interdigitated with sixth conductive fingers at an Mx-2 interconnect level. The fifth conductive fingers are offset from the third conductive fingers. The sixth conductive fingers are offset from the fourth conductive fingers. The capacitor further includes seventh conductive fingers interdigitated with eighth conductive fingers at an Mx-3 interconnect level. The seventh conductive fingers are offset from the fifth conductive fingers. The eighth conductive fingers are offset from the sixth conductive fingers. A first set of vias electrically couples the first conductive fingers to the fifth conductive fingers.

11 Claims, 13 Drawing Sheets

(56) References Cited

U.S. PATENT DOCUMENTS

| | | | |
|---|---|---|---|
| 2009/0160020 A1* | 6/2009 | Barth | H01L 23/5223 |
| | | | 257/532 |
| 2009/0230509 A1* | 9/2009 | MacIntosh | H01L 23/5223 |
| | | | 257/532 |
| 2010/0109113 A1 | 5/2010 | Jang | |
| 2010/0177457 A1* | 7/2010 | Willard | H01G 4/012 |
| | | | 361/301.4 |
| 2012/0119326 A1 | 5/2012 | Sugisaki et al. | |
| 2014/0203401 A1* | 7/2014 | Li | H01L 23/5223 |
| | | | 257/532 |
| 2015/0048482 A1* | 2/2015 | Shih | H01L 23/5223 |
| | | | 257/532 |
| 2017/0154951 A1* | 6/2017 | Cui | H01L 28/88 |

* cited by examiner

FINGER METAL-OXIDE-METAL (FMOM) CAPACITOR

BACKGROUND

Field

Aspects of the present disclosure relate to semiconductor devices and, more particularly, to capacitors in semiconductor structures.

Background

In advanced complementary metal-oxide-semiconductor (CMOS) technologies, a finger metal-oxide-metal (FMOM) capacitor is desired for providing a de-coupling capacitor having a high capacitance value within a small device footprint. Unfortunately, conventional FMOM structures have low capacitance and do not satisfy circuit design specifications for implementing a de-coupling capacitor. Therefore, there is a desire for a FMOM capacitor that overcomes these deficiencies.

SUMMARY

A capacitor may include a first set of conductive fingers interdigitated with a second set of conductive fingers at an Mx interconnect level. The capacitor may further include a third set of conductive fingers interdigitated with a fourth set of conductive fingers at an Mx-1 interconnect level. The third set of conductive fingers may be offset from the first set of conductive fingers. The second set of conductive fingers may be offset from the fourth set of conductive fingers. The capacitor may further include a fifth set of conductive fingers interdigitated with a sixth set of conductive fingers at an Mx-2 interconnect level. The fifth set of conductive fingers may be offset from the third set of conductive fingers. The sixth set of conductive fingers may be offset from the fourth set of conductive fingers. The capacitor may further include a seventh set of conductive fingers interdigitated with an eighth set of conductive fingers at an Mx-3 interconnect level. The seventh set of conductive fingers may be offset from the fifth set of conductive fingers. The eighth set of conductive fingers may be offset from the sixth set of conductive fingers. The capacitor may further include a first set of vias electrically coupling the first set of conductive fingers to the fifth set of conductive fingers.

A method of fabricating a capacitor may include interdigitating a first set of conductive fingers with a second set of conductive fingers at an Mx interconnect level. The method may further include interdigitating a third set of conductive fingers with a fourth set of conductive fingers at an Mx-1 interconnect level. The third set of conductive fingers may be offset from the first set of conductive fingers. The second set of conductive fingers may be offset from the fourth set of conductive fingers. The method may further include interdigitating a fifth set of conductive fingers with a sixth set of conductive fingers at an Mx-2 interconnect level. The fifth set of conductive fingers may be offset from the third set of conductive fingers. The sixth set of conductive fingers may be offset from the fourth set of conductive fingers. The method also includes interdigitating a seventh set of conductive fingers with an eighth set of conductive fingers at an Mx-3 interconnect level. The seventh set of conductive fingers may be offset from the fifth set of conductive fingers. The eighth set of conductive fingers may be offset from the sixth set of conductive fingers. The method still further include fabricating a first set of vias. The first set of vias may electrically couple the first set of conductive fingers to the fifth set of conductive fingers.

A capacitor may include a first set of conductive fingers interdigitated with a second set of conductive fingers at an Mx interconnect level. The capacitor also include a third set of conductive fingers interdigitated with a fourth set of conductive fingers at an Mx-1 interconnect level. The third set of conductive fingers may be offset from the first set of conductive fingers. The second set of conductive fingers may be offset from the fourth set of conductive fingers. The capacitor may further include a fifth set of conductive fingers interdigitated with a sixth set of conductive fingers at an Mx-2 interconnect level. The fifth set of conductive fingers may be offset from the third set of conductive fingers. The sixth set of conductive fingers may be offset from the fourth set of conductive fingers. The capacitor still further include a seventh set of conductive fingers interdigitated with an eighth set of conductive fingers at an Mx-3 interconnect level. The seventh set of conductive fingers may be offset from the fifth set of conductive fingers. The eighth set of conductive fingers may be offset from the sixth set of conductive fingers. The capacitor also include means for coupling the first set of conductive fingers to the fifth set of conductive fingers.

Additional features and advantages of the present disclosure will be described below. It should be appreciated by those skilled in the art that this present disclosure may be readily utilized as a basis for modifying or designing other structures for carrying out the same purposes of the present disclosure. It should also be realized by those skilled in the art that such equivalent constructions do not depart from the teachings of the present disclosure as set forth in the appended claims. The novel features, which are believed to be characteristic of the present disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
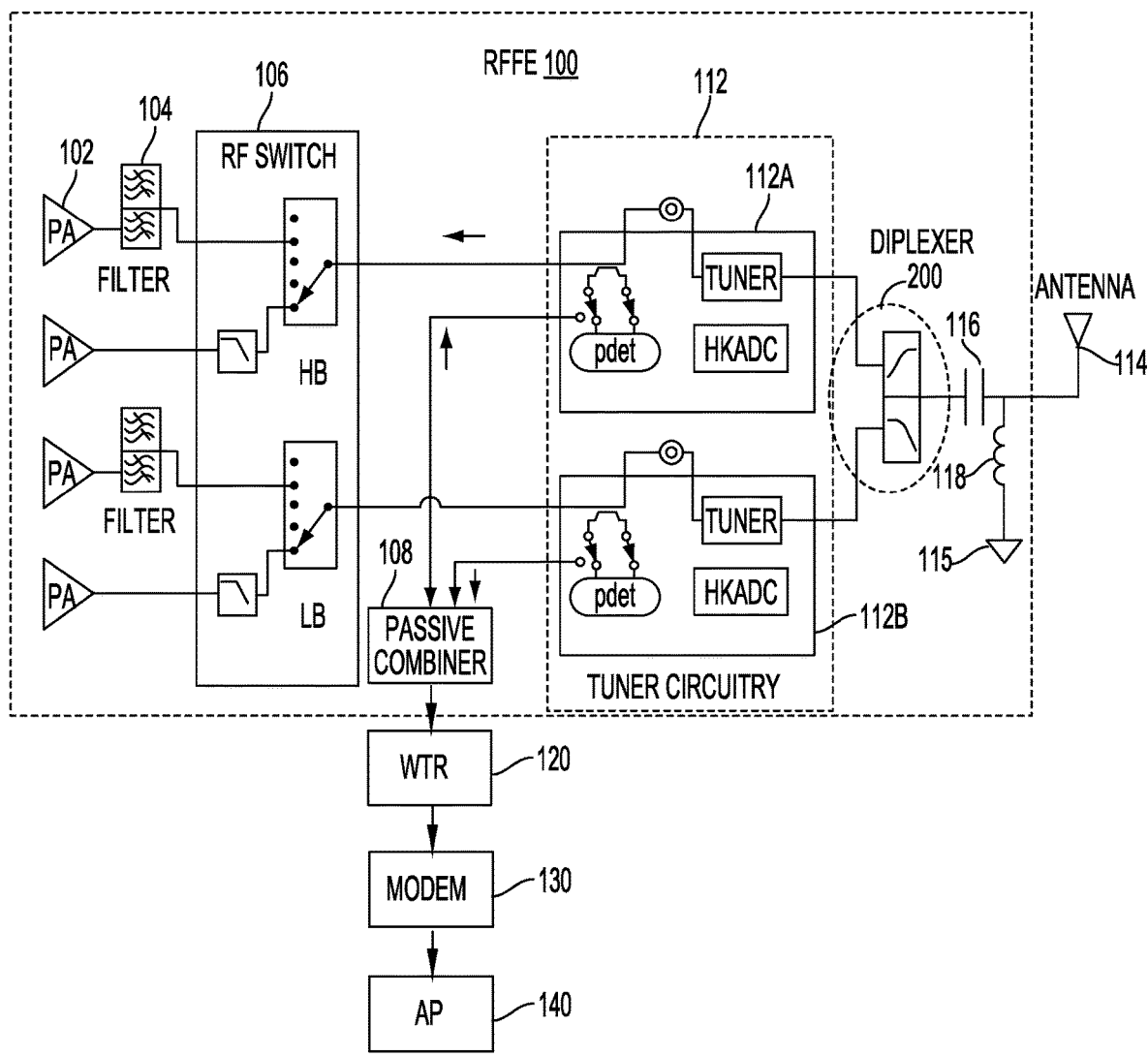
FIG. 1 is a schematic diagram of a radio frequency (RF) front end (RFFE) module employing passive devices.

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. It will be apparent, however, to those skilled in the art that these concepts may be practiced without these specific details. In some instances, well-known structures and components are shown in block diagram form in order to avoid obscuring such concepts.

As described herein, the use of the term "and/or" is intended to represent an "inclusive OR," and the use of the term "or" is intended to represent an "exclusive OR." As described herein, the term "exemplary" used throughout this description means "serving as an example, instance, or illustration," and should not necessarily be construed as preferred or advantageous over other exemplary configurations. The term "coupled" used throughout this description means "connected, whether directly or indirectly through intervening connections (e.g., a switch), electrical, mechanical, or otherwise," and is not necessarily limited to physical connections. Additionally, the connections can be such that the objects are permanently connected or releasably connected. The connections can be through switches. As described herein, the term "proximate" used throughout this description means "adjacent, very near, next to, or close to." As described herein, the term "on" used throughout this description means "directly on" in some configurations, and "indirectly on" in other configurations.

Mobile communications devices have become common. The prevalence of these mobile devices is driven in part by the many functions that are now enabled on such devices. Demand for such functions increases processing capability specifications and creates a desire for more powerful batteries. Within the limited space inside the housing of a mobile communications device, batteries compete with the processing circuitry. These and other factors contribute to a continued miniaturization of components within the mobile communications device.

Miniaturization of the components impacts all aspects of the processing circuitry including the transistors and passive elements of the processing circuitry, such as capacitors. One miniaturization technique involves moving some passive elements from the printed circuit board into the integrated circuitry. One technique for moving passive elements into the integrated circuitry involves creating metal-oxide-metal (MOM) capacitors during back-end-of-line (BEOL) integrated circuit fabrication. Each integrated circuit complies with a collection of process parameters for allowing manufacturing of circuits for operating under desired specifications (sometimes called a "process window"). The process window may be unique to a particular integrated circuit or may be duplicated across a product line or have other applications as desired. Nevertheless, the existence of a corresponding process window effectively sets forth the thresholds with which an integrated circuit complies to be suitable for functioning as designed (e.g., an integrated circuit in a mobile communications device).

Many current back-end-of-line MOM capacitors have a two element interdigitated structure. Such capacitors are created using masks and deposition processes. In such processes, a substrate may be provided with a mask that is positioned thereon. A deposition technique may generate the two conductive elements of the capacitor. In this regard, the two conductive elements form the positive and negative nodes of the capacitor. Because capacitance is a function of the size of the conductive elements, increased capacitance is achieved through larger positive and negative nodes. Nevertheless, larger nodes increase the footprint of the capacitor, defeating the miniaturization goals. In addition, the larger nodes conflict with the process window and increase local stress significantly.

One approach for creating higher capacitance MOM devices is providing a layered interdigitated structure, in which additional layers of interdigitated structures are stacked vertically on top of each other. In this manner, the size of the nodes is effectively increased because each node has conductive elements in multiple planes. These larger nodes create a capacitor having a higher capacitance because each of the layers contributes to the overall capacitance of the device. Furthermore, additional capacitance is created between the layers. In some MOM devices, alternating layers of interdigitated structures are rotated relative to layers above and below one another.

Semiconductor fabrication processes are often divided into three parts: a front-end-of-line (FEOL), a middle-of-line (MOL), and a back-end-of-line (BEOL). Front-end-of-line processes include wafer preparation, isolation, well formation, gate patterning, spacers, and dopant implantation. A middle-of-line process includes gate and terminal contact formation. The gate and terminal contact formation of the middle-of-line process, however, is an increasingly challenging part of the fabrication flow, particularly for lithography patterning. Back-end-of-line processes include forming interconnects and dielectric layers for coupling to the FEOL devices. These interconnects may be fabricated with a dual damascene process using plasma-enhanced chemical vapor deposition (PECVD) deposited interlayer dielectric (ILD) materials.

More recently, the number of interconnect levels for circuitry has substantially increased due to the large number of devices that are now interconnected in a modern microprocessor. The increased number of interconnect levels for supporting the increased number of devices involves more intricate middle-of-line processes to perform the gate and terminal contact formation.

In particular, advances in lithography have reduced line spacing to the nanometer range in integrated circuit chips. The reduced line spacing increases the available area for capacitance because more lines of charge storage can be placed in the same volume of material. Further, back-end-of-line interconnect structures, as described in one aspect of the present disclosure, allow for an improved capacitor structure.

As described, the middle-of-line interconnect layers may refer to the conductive interconnects for connecting a first conductive layer (e.g., metal 1 (M1)) to an oxide diffusion (OD) layer of an integrated circuit as well for connecting M1 to the active devices of the integrated circuit. The middle-of-line interconnect layers for connecting M1 to the OD layer of an integrated circuit may be referred to as "MD1" and "MD2," collectively referred to herein as "MD interconnects." The middle-of-line interconnect layer for connecting M1 to the polysilicon gates of an integrated circuit may be referred to as "MP," or "MP interconnects." Within the present disclosure, the term "M1" is intended to describe any type of conductive material, not just metal, in the closest layer to the devices.

In advanced complementary metal-oxide-semiconductor (CMOS) technologies, a finger metal-oxide-metal (FMOM) capacitor is used as a de-coupling capacitor, which has a high capacitance value with a small device footprint. Conventional FMOM structures have low capacitance and do not satisfy circuit design specifications. Therefore, there is a desire for a FMOM capacitor that overcomes these deficiencies.

Aspects of the present disclosure provide a FMOM capacitor having super-via structures. Super-vias may couple interconnect layers that are more than one interconnect layer apart to each other. For example, a super-via may couple an M1 interconnect layer to an M3 interconnect layer. Advantages of the FMOM capacitor include ~260% increased FMOM capacitance without increasing a device footprint. No additional materials are used, as the super-vias provide a structural change and do not negatively impact other parts of the chip.

FIG. 1 is a schematic diagram of a radio frequency (RF) front end (RFFE) module 100 employing passive devices including a capacitor 116 (such as finger metal-oxide-metal (FMOM) capacitor structure) that could be integrated with an inductor 118. The RF front end module 100 includes power amplifiers 102, duplexer/filters 104, and a radio frequency (RF) switch module 106. The power amplifiers 102 amplify signals to a certain power level for transmission. The duplexer/filters 104 filter the input/output signals according to a variety of different parameters, including frequency, insertion loss, rejection, or other like parameters. In addition, the RF switch module 106 may select certain portions of the input signals to pass on to the rest of the RF front end module 100.

The radio frequency (RF) front end module 100 also includes tuner circuitry 112 (e.g., first tuner circuitry 112A and second tuner circuitry 112B), the diplexer 200, a capacitor 116, an inductor 118, a ground terminal 115, and an antenna 114. The tuner circuitry 112 (e.g., the first tuner circuitry 112A and the second tuner circuitry 112B) includes components such as a tuner, a portable data entry terminal (PDET), and a house keeping analog to digital converter (HKADC). The tuner circuitry 112 may perform impedance tuning (e.g., a voltage standing wave ratio (VSWR) optimization) for the antenna 114. The RF front end module 100 also includes a passive combiner 108 coupled to a wireless transceiver (WTR) 120. The passive combiner 108 combines the detected power from the first tuner circuitry 112A and the second tuner circuitry 112B. The wireless transceiver 120 processes the information from the passive combiner 108 and provides this information to a modem 130 (e.g., a mobile station modem (MSM)). The modem 130 provides a digital signal to an application processor (AP) 140.

As shown in FIG. 1, the diplexer 200 is between the tuner component of the tuner circuitry 112 and the capacitor 116, the inductor 118, and the antenna 114. The diplexer 200 may be placed between the antenna 114 and the tuner circuitry 112 to provide high system performance from the RF front end module 100 to a chipset including the wireless transceiver 120, the modem 130, and the application processor 140. The diplexer 200 also performs frequency domain multiplexing on both high band frequencies and low band frequencies. After the diplexer 200 performs its frequency multiplexing functions on the input signals, the output of the diplexer 200 is fed to an optional LC (inductor/capacitor) network including the capacitor 116 and the inductor 118. The LC network may provide extra impedance matching components for the antenna 114, when desired. Then, a signal with the particular frequency is transmitted or received by the antenna 114. Although a single capacitor and inductor are shown, multiple components are also contemplated.

Figure 2:
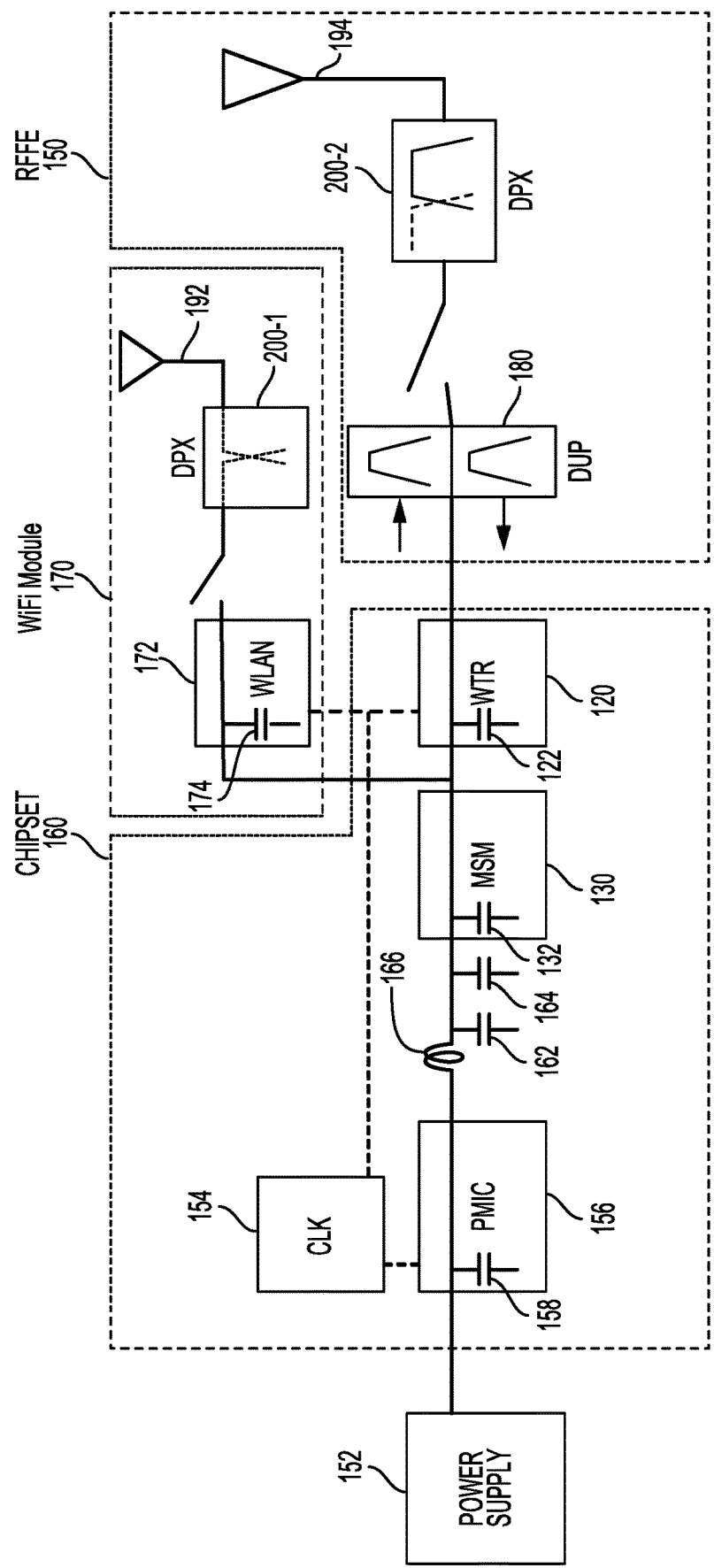
FIG. 2 is a schematic diagram of a radio frequency (RF) front end (RFFE) module employing passive devices for a chipset.

FIG. 2 is a schematic diagram of a wireless local area network (WLAN) (e.g., WiFi) module 170 including a first diplexer 200-1 and an RF front end (RFFE) module 150 including a second diplexer 200-2 for a chipset 160, including a finger metal-oxide-metal (FMOM) capacitor structure. The WiFi module 170 includes the first diplexer 200-1 communicably coupling an antenna 192 to a wireless local area network module (e.g., WLAN module 172). The RF front end module 150 includes the second diplexer 200-2 communicably coupling an antenna 194 to the wireless transceiver (WTR) 120 through a duplexer 180. The wireless transceiver 120 and the WLAN module 172 of the WiFi module 170 are coupled to a modem (MSM, e.g., baseband modem) 130 that is powered by a power supply 152 through a power management integrated circuit (PMIC) 156. The chipset 160 also includes capacitors 162 and 164, as well as an inductor(s) 166 to provide signal integrity.

The PMIC 156, the modem 130, the wireless transceiver 120, and the WLAN module 172 each include capacitors (e.g., 158, 132, 122, and 174) and operate according to a clock 154. In addition, the inductor 166 couples the modem 130 to the PMIC 156. The geometry and arrangement of the various capacitors and inductor in the chipset 160 may consume substantial chip area.

Figure 3:
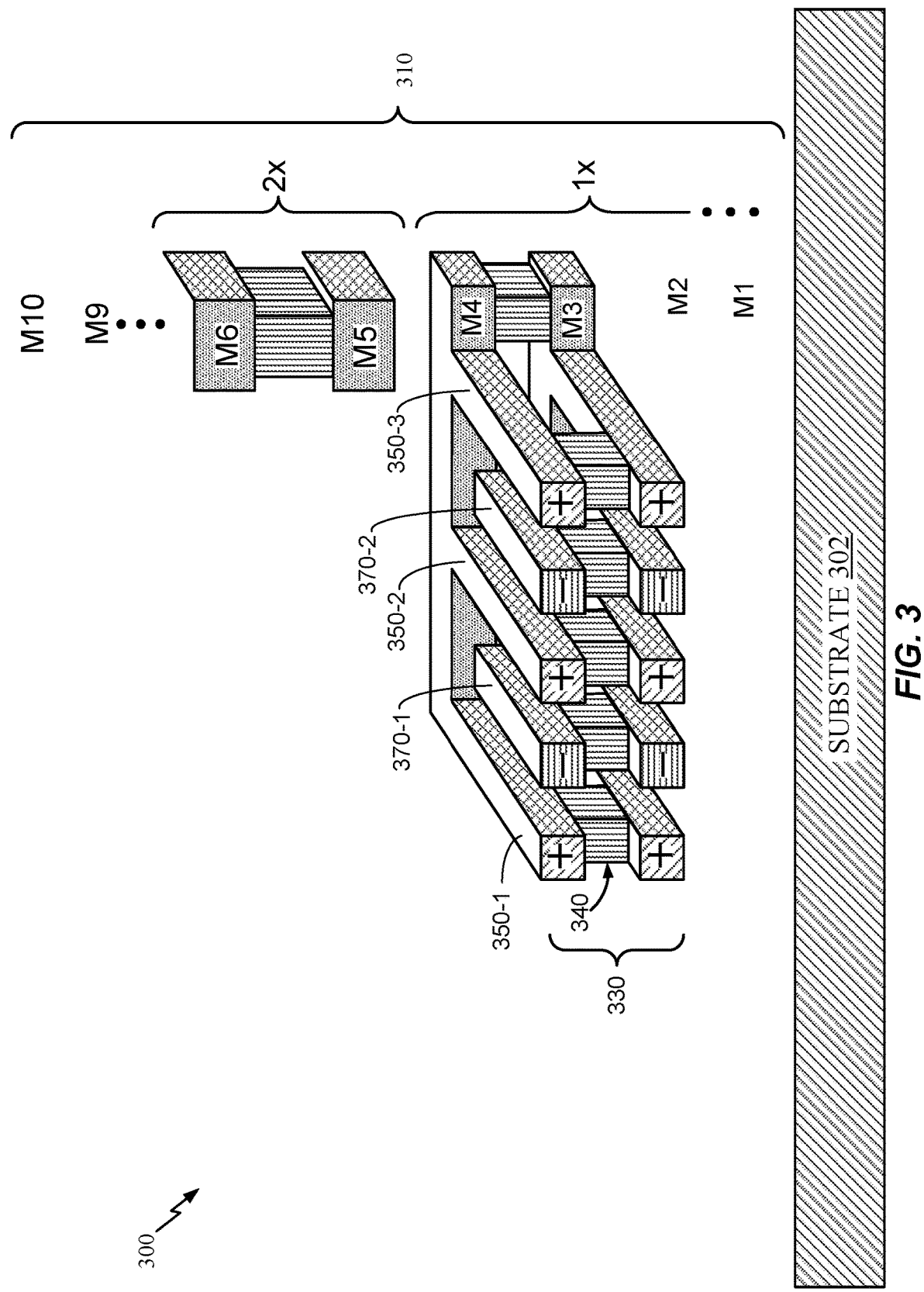
FIG. 3 is a cross section illustrating an integrated circuit (IC) device including an interconnect stack that contains metal-oxide-metal (MOM) capacitor structures.

FIG. 3 is a block diagram illustrating a cross section of an analog integrated circuit (IC) device 300 including an interconnect stack 310, hosting a finger metal-oxide-metal (FMOM) capacitor structure. The interconnect stack 310 of the IC device 300 includes multiple conductive interconnect layers (M1, . . . , M9, M10) on a semiconductor substrate (e.g., a diced silicon wafer) 302. The semiconductor substrate 302 support a metal-oxide-metal (MOM) capacitor 330 and/or a metal-oxide-semiconductor (MOS). In this example, the MOM capacitor 330 is formed in the M3 and M4 interconnect layers, below the M5 and M6 interconnect layers. The MOM capacitor 330 is formed from lateral conductive fingers of different polarities using the conductive interconnect layers (M3 and M4) of the interconnect stack 310. A dielectric (not shown) is provided between the conductive fingers.

In this example, the MOM capacitor 330 is formed within the lower conductive interconnect layers (e.g., M1-M4) of the interconnect stack 310. The lower conductive interconnect layers of the interconnect stack 310 have smaller interconnect widths and spaces. For example, the dimensions of the conductive interconnect layers M3 and M4 are half the size of the dimensions of the conductive interconnect layers M5 and M6. Likewise, the dimensions of the conductive interconnect layers M1 and M2 are half the size of the dimensions of the conductive interconnect layers M3 and M4. The small interconnect widths and spaces of the lower conductive interconnect layers enable the formation of MOM capacitors with increased capacitance density.

As shown in FIG. 3, the MOM capacitor 330 makes use of a lateral (intra layer) capacitive coupling 340 between fingers (e.g., 350, 370) formed by standard metallization of the conductive interconnects (e.g., wiring lines and vias).

Aspects of the present disclosure provide a FMOM capacitor having super-via structures. Advantages include ~260% increased FMOM capacitance without increasing a device footprint. No additional materials are used, as the super-vias provide a structural change and do not negatively impact other parts of the chip.

Figure 4A:
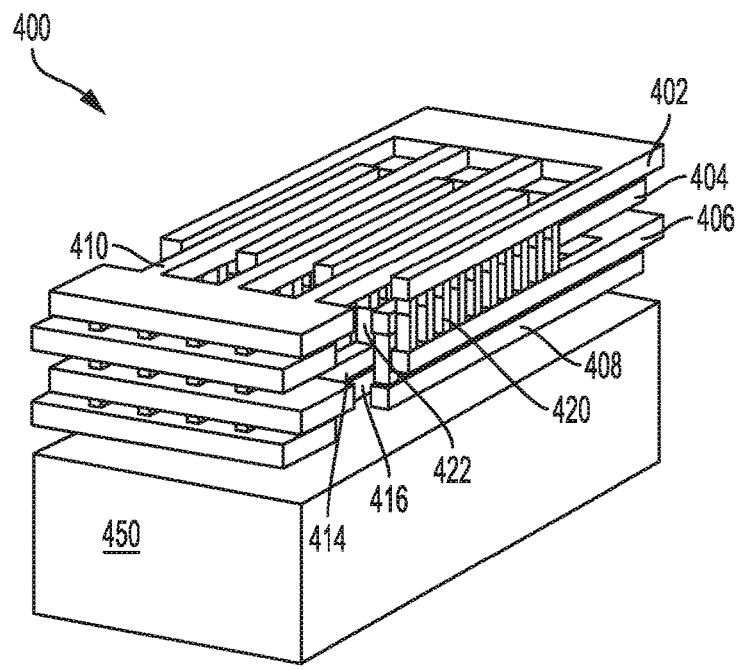
FIG. 4A illustrates a finger metal-oxide-metal (FMOM) capacitor structure, according to aspects of the present disclosure.
Figure 4B:
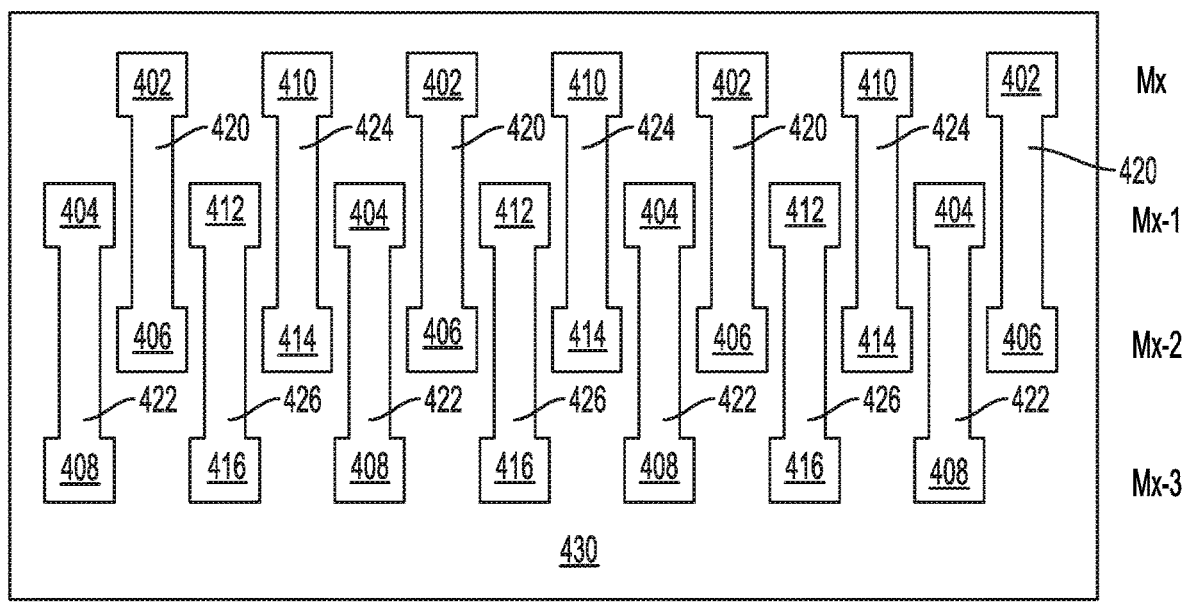
FIG. 4B illustrates a cross-sectional view of the FMOM capacitor of FIG. 4A, according to aspects of the present disclosure.

FIGS. 4A and 4B illustrate perspective and cross-sectional views of a finger metal-oxide-metal (FMOM) capacitor structure 400, according to aspects of the present disclosure. The capacitor 400 may include a first set of fingers 402 interdigitated with a second set of fingers 410 on an Mx interconnect level. For example, the Mx interconnect level may be an M4 interconnect level. The capacitor 400 may further include a third set of fingers 404 interdigitated with a fourth set of fingers 412 on an Mx-1 interconnect level. For example, the Mx-1 interconnect level may be an M3 interconnect level. The capacitor 400 may further include a fifth set of fingers 406 interdigitated with a sixth set of fingers 414 on an Mx-2 interconnect level. For example, the Mx-2 interconnect level may be an M2 interconnect level. The capacitor 400 may also include a seventh set of fingers 408 interdigitated with an eighth set of fingers 416 on an Mx-3 interconnect level. For example, the Mx-3 interconnect level may be an M1 interconnect level. Additionally, the Mx-3 interconnect level may be supported by a substrate 450. It is understood that the interconnect levels described are exemplary only, and other interconnect levels may be used.

The capacitor 400 may include a first set of vias 420 coupling the first set of fingers 402 to the fifth set of fingers 406. The capacitor 400 may further include a second set of vias 422 coupling the third set of fingers 404 to the seventh set of fingers 408. For example, the second set of vias 422 may be offset from the first set of vias 420. The capacitor 400 may include a third set of vias 424 coupling the second set of fingers 410 to the sixth set of fingers 414. The capacitor 400 may also include a fourth set of vias 426 coupling the fourth set of fingers 412 with the eighth set of fingers 416. The third set of vias 424 may be offset from the fourth set of vias 426.

According to aspects of the present disclosure, the sets of vias 420-426 are super-vias that couple interconnect layers more than one level apart to each other. For example, the sets of vias 420 and 424 may couple the Mx interconnect level to the Mx-2 interconnect level, and the sets of vias 422 and 426 may couple the Mx-1 interconnect level to the Mx-3 interconnect level. The sets of fingers 402-416 and the vias 420-426 may be encompassed by a dielectric 430. For example, a high-k dielectric covers the conductive fingers.

According to aspects of the present disclosure, the conductive fingers may be orthogonal to the vias, as illustrated in FIGS. 4A and 4B. Additionally, a pitch (e.g., a metal pitch) between the conductive fingers may vary within a same interconnect level.

According to aspects of the present disclosure, conductive fingers in consecutive layers may be parallel to each other, as illustrated in FIG. 4A. Alternatively, conductive fingers in consecutive layers may be perpendicular to each other. For example, the first set of conductive fingers 402 and the second set of conductive fingers 410 may be fabricated to be orthogonal to the third set of conductive fingers 404 and the fourth set of conductive fingers 412. The same arrangement would apply to the rest of the sets of conductive fingers. For example, the third set of conductive fingers 404 and the fourth set of conductive fingers 412 may be fabricated to be orthogonal to the first set of conductive fingers 402 and the second set of vias 422.

According to aspects of the present disclosure, an alignment of the first set of vias 420 may be tuned with respect to the second set of vias 422. Tuning may also be applied to the rest of the sets of conductive fingers. According to an aspect of the present disclosure, the first set of vias 420 may be aligned with the second set of vias 422, and the third set of vias 424 may be aligned with the fourth set of vias 426.

Figure 5A:
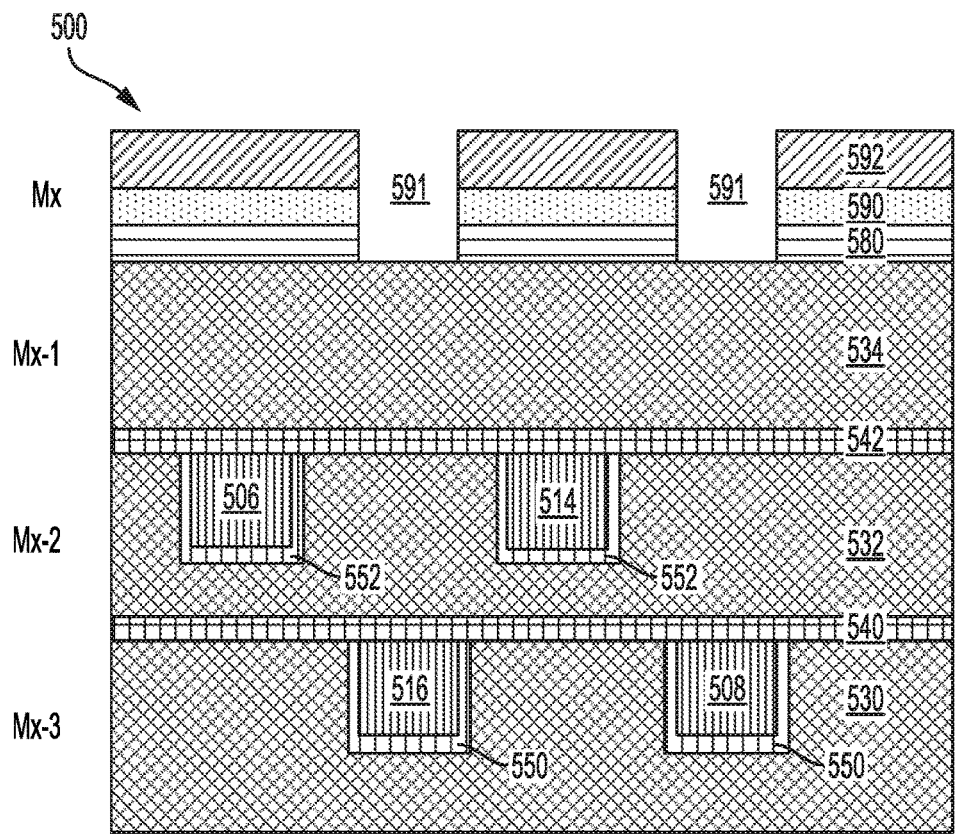
FIGS. 5A-5K illustrate a fabrication process for a finger metal-oxide-metal (FMOM) capacitor structure, according to aspects of the present disclosure.

FIGS. 5A-5K illustrate a fabrication process for a finger metal-oxide-metal (FMOM) capacitor structure 500, according to aspects of the present disclosure. As illustrated in FIG. 5A, a staggered interconnect structure may be fabricated up to an Mx-1 interconnect level. For example, a seventh set of fingers 508 and an eighth set of fingers 516 may be fabricated in a first dielectric layer 530 at an Mx-3 interconnect level. A first barrier layer 550 may surround at least sidewalls and a bottom surface of each of the seventh set of fingers 508 and the eighth set of fingers 516. A first separation layer 540 may separate the first dielectric layer 530 from a second dielectric layer 532. For example, the first separation layer 540 may be titanium nitride (TiN). The first separation layer 540 may also be coupled to a top surface of each of the seventh set of fingers 508 and the eighth set of fingers 516.

A fifth set of fingers 506 and a sixth set of fingers 514 may be fabricated in the second dielectric layer 532 at an Mx-2 interconnect level. For example, the fifth set of fingers 506 and the sixth set of fingers 514 may be offset from the seventh set of fingers 508 and the eighth set of fingers 516. A second barrier layer 552 may surround at least sidewalls and a bottom surface of each of the fifth set of fingers 506 and the sixth set of fingers 514. A second separation layer 542 may separate the second dielectric layer 532 from a third dielectric layer 534. For example, the second separation layer 542 may be TiN.

According to aspects of the present disclosure, a titanium nitride (TiN) layer 580 may be deposited on the third dielectric layer 534 at an Mx interconnect level. A backside anti-reflection coating 590 and a photo resist layer 592 may be deposited on the TiN layer 580. The TiN layer 580, the backside anti-reflection coating 590 and the photo resist layer 592 may be patterned to create trenches 591 that may be offset from the fifth set of fingers 506 and the sixth set of fingers 514. The trenches 591 align with the seventh set of fingers 508 and the eighth set of fingers 516.

Figure 5B:
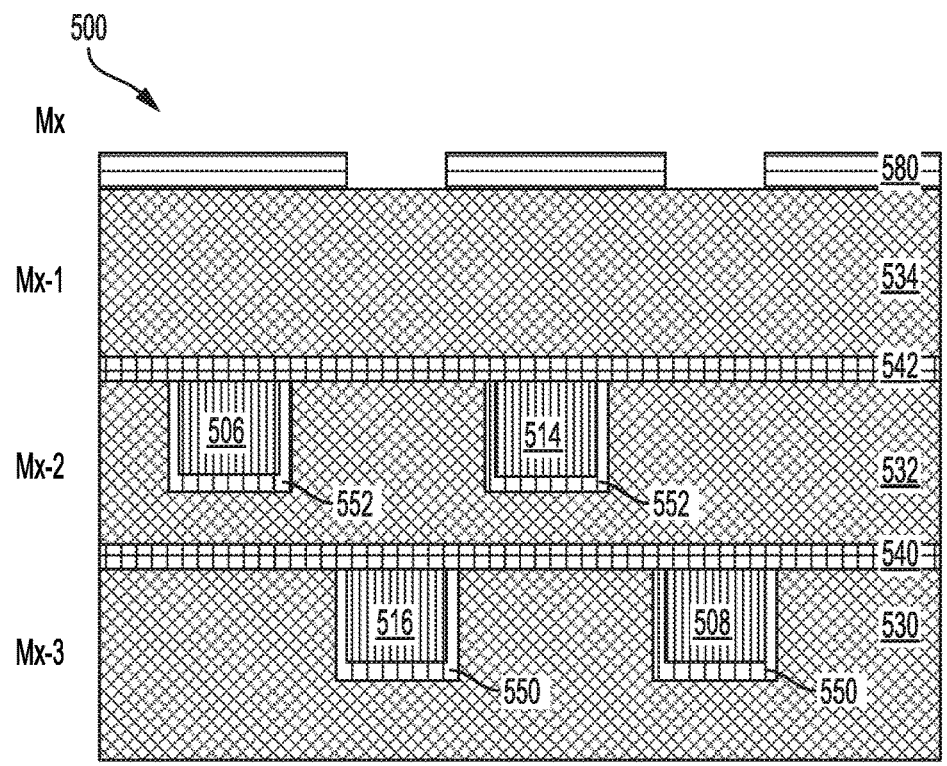

As illustrated in FIG. 5B, the photo resist layer 592 and the anti-reflection coating 590 are etched away. For example, the trenches 591 may be formed on the Mx interconnect level by lithographic patterning and hard mask etching of the TiN layer 580.

Figure 5C:
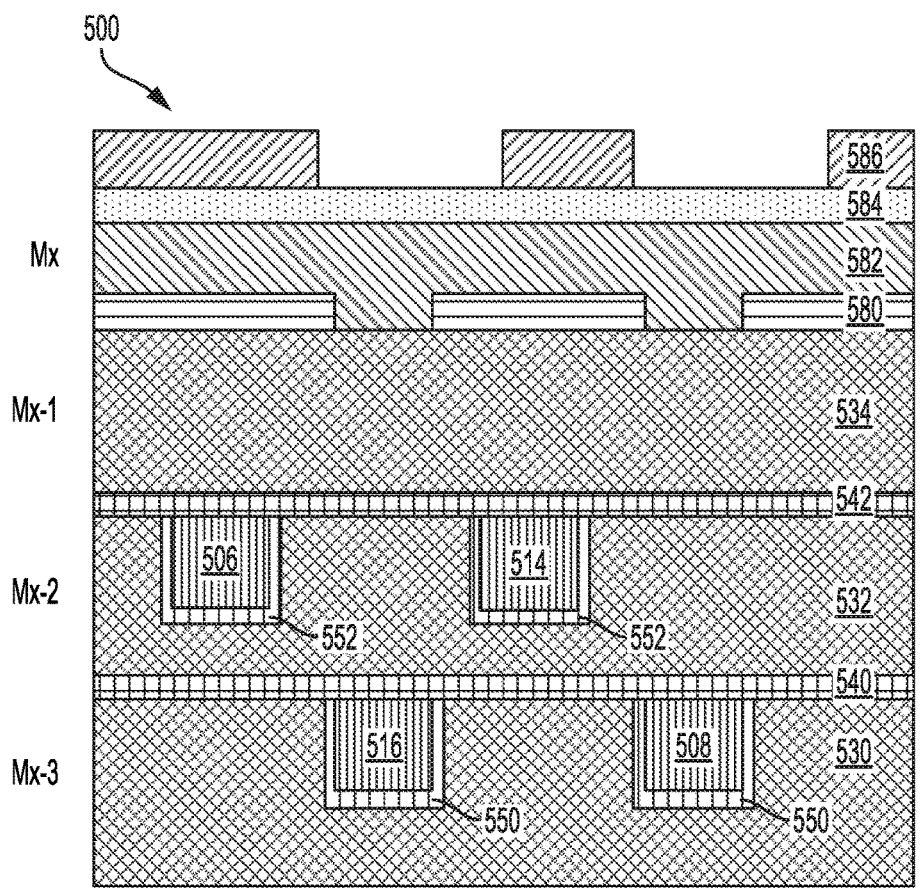

FIG. 5C illustrates a lithography and etch process for via and/or super-via patterning. According to aspects of the present disclosure, an oxide dielectric layer 582, a backside anti-reflection coating 584, and a photo resist layer 586 may be deposited on the TiN layer 580 through a super-via lithography patterning process.

Figure 5D:
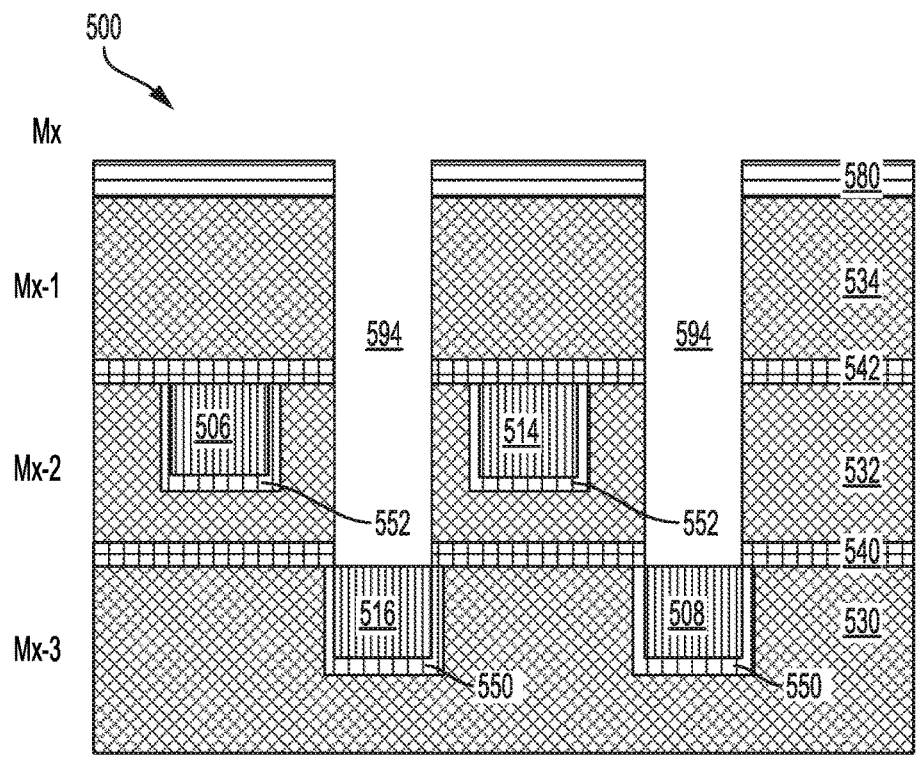

As illustrated in FIG. 5D, deep trenches 594 (e.g., exposed wells) may be formed by etching and ashing. For example, the oxide dielectric layer 582, the backside anti-reflection coating 584, and the photo resist layer 586, along with portions of the third dielectric layer 534, the second separation layer 542, the second dielectric layer 532, and the first separation layer 540 may be etched away and ashed to form the deep trenches 594. According to an aspect of the present disclosure, the deep trenches 594 may extend from the Mx interconnect level through the Mx-2 interconnect level.

Figure 5E:
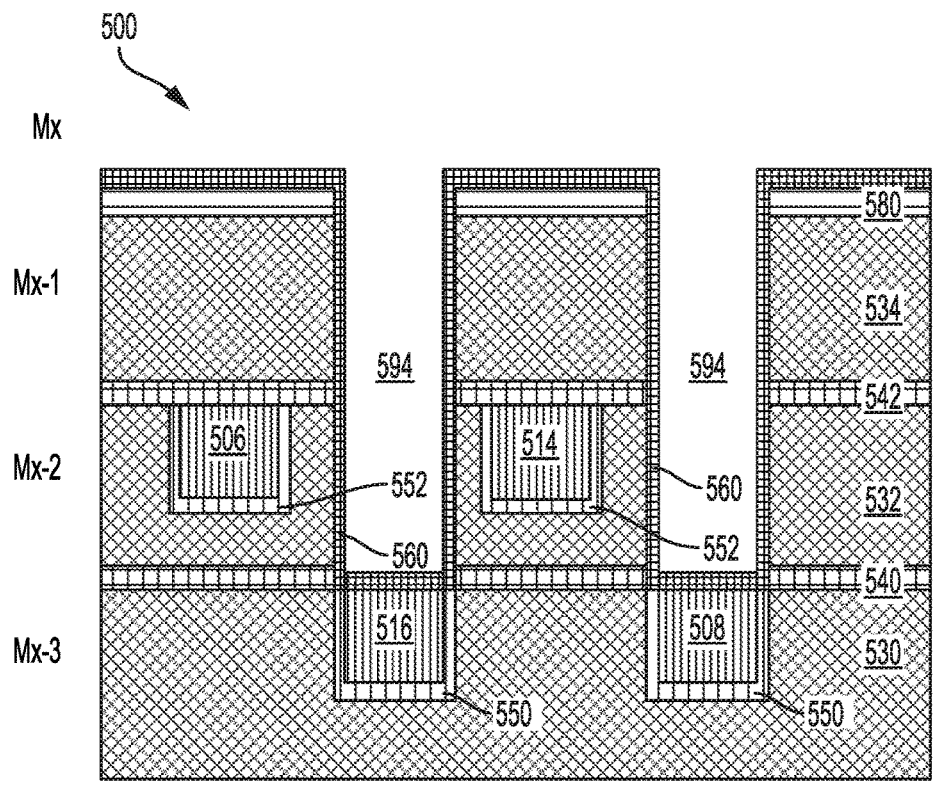
Figure 5F:
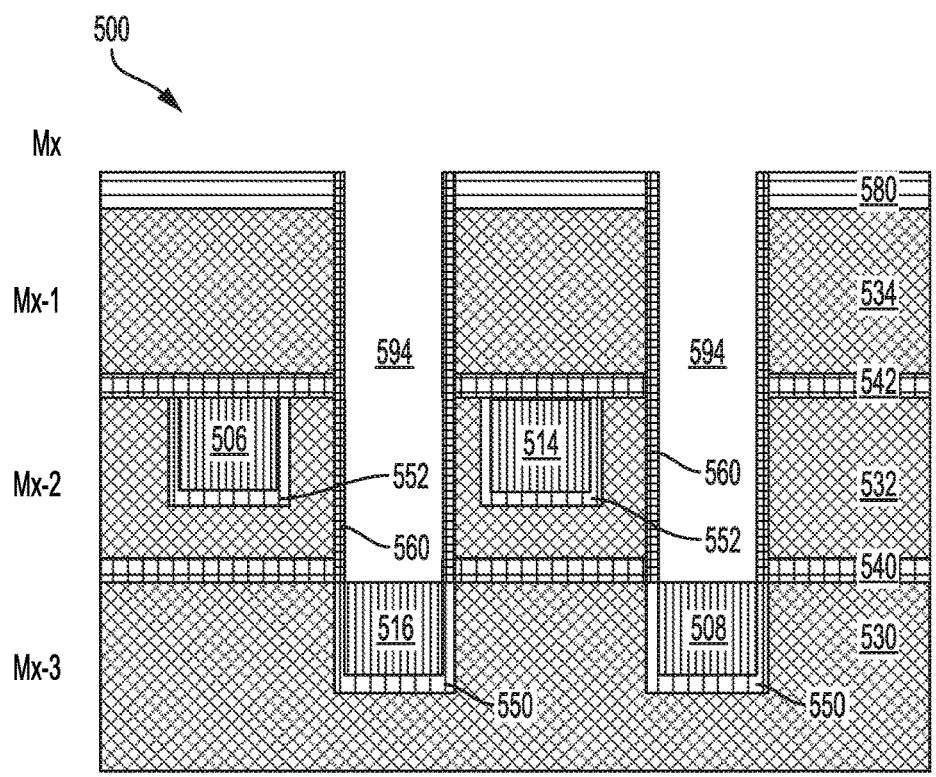

As illustrated in FIG. 5E, an isolation dielectric layer 560 may be deposited on the TiN layer 580, sidewalls of the deep trenches 594, and top surfaces of the seventh set of fingers 508 and the eighth set of fingers 516. For example, the isolation dielectric layer 560 may be silicon nitride (SiN), silicon oxynitride (SiON), silicon cyanide (SiCN), etc. FIG. 5F illustrates removal of portions of the isolation dielectric layer 560. For example, an anisotropic etch may remove the isolation dielectric layer 560 from the TiN layer 580 and the top surfaces of the seventh set of fingers 508 and the eighth set of fingers 516. The isolation dielectric layer 560 remains on the sidewalls of the deep trenches 594.

Figure 5G:
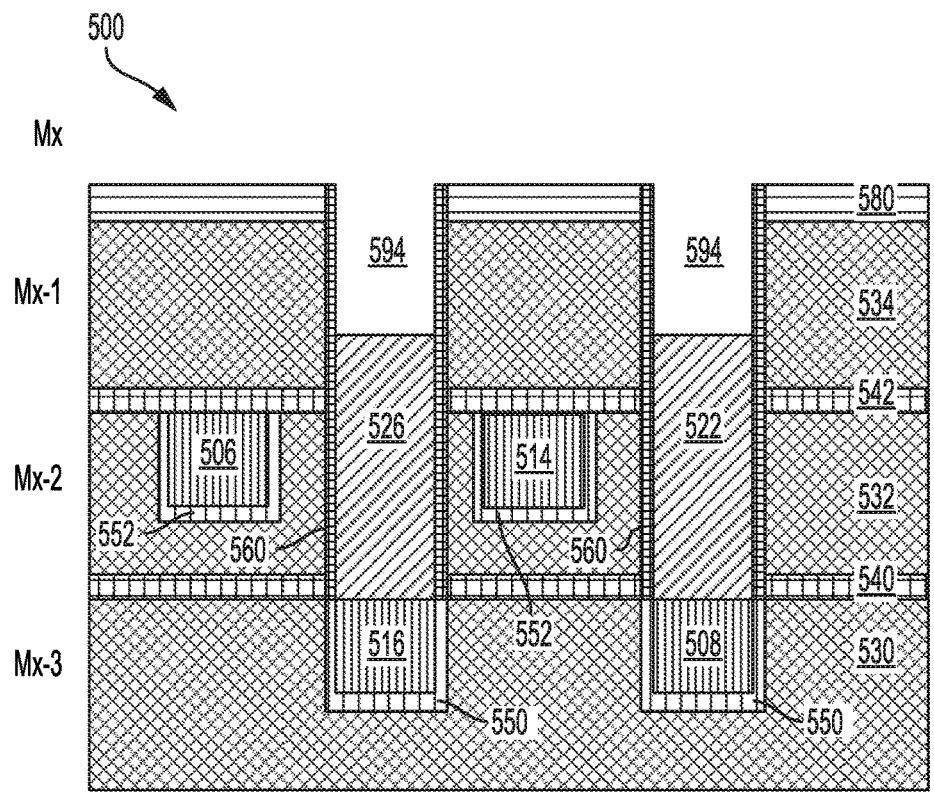
Figure 5H:
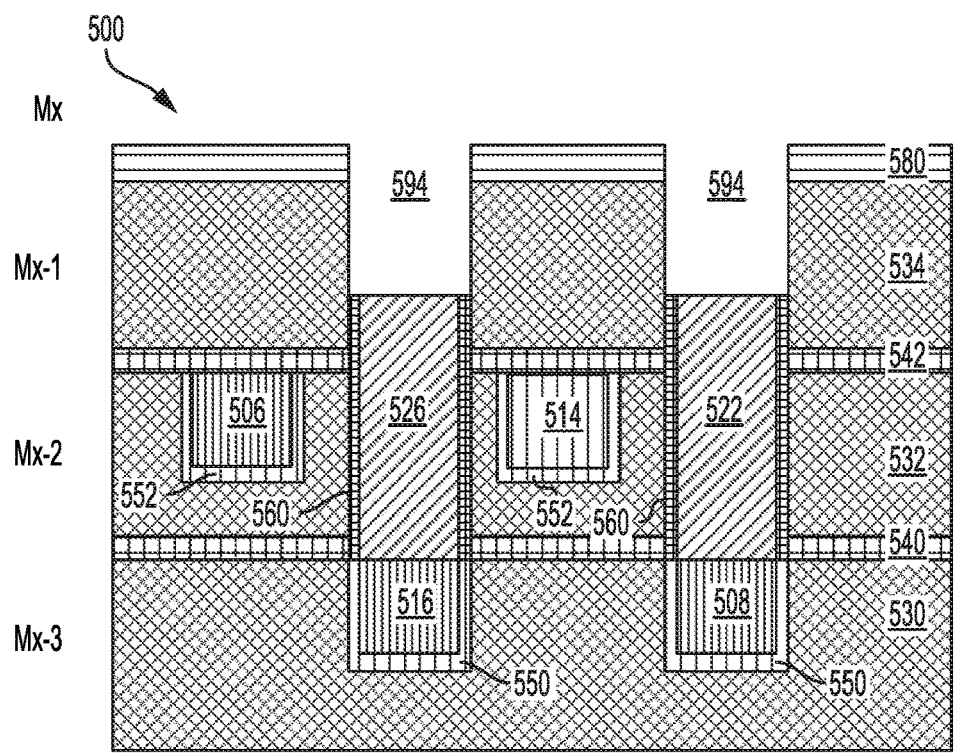

FIGS. 5G to 5H illustrate formation of super-vias 522 and 526. For example, the deep trenches 591 may be partially filled with a conductive material (e.g., Co, Ru, etc.) through an electroless deposition process to form the super-vias 522 and 526. According to an aspect of the present disclosure, the deep trenches 591 may be filled from the top surfaces of the seventh set of fingers 508 and the eighth set of fingers 516, through the Mx-2 interconnect level, and less than halfway through the Mx-1 interconnect level. Of course, the deep trenches 594 may be filled more or less depending on a desired length of the super-vias 522 and 526. The isolation dielectric layer 560 may then be etched away from the portions of the sidewalls of the deep trenches 594 not filled with the conductive material.

Figure 5I:
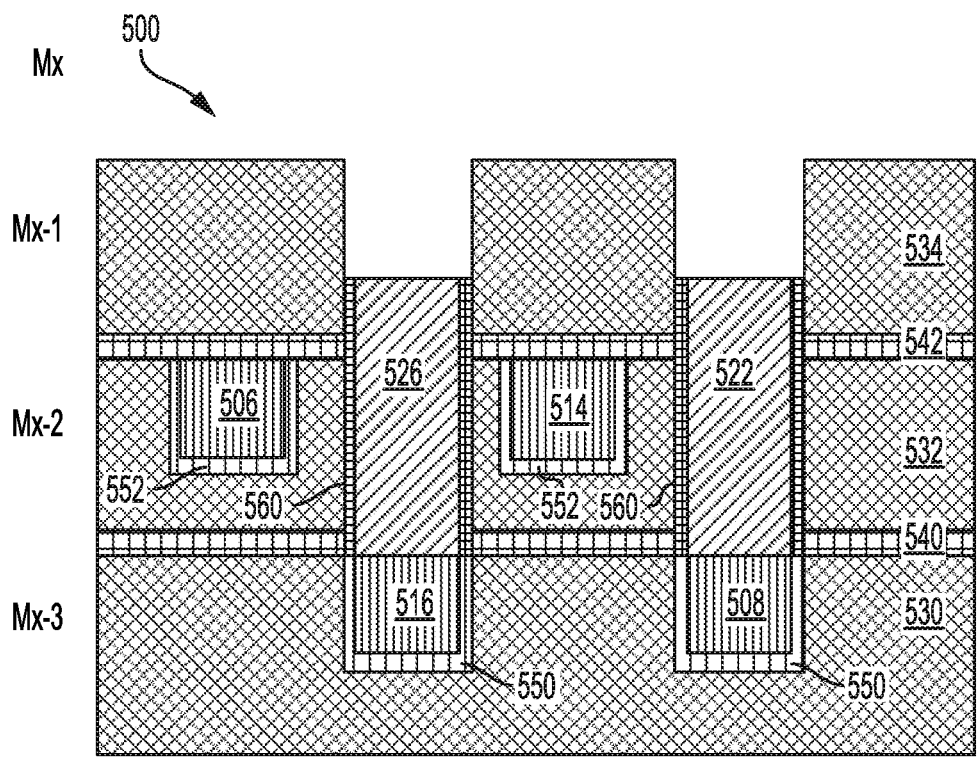
Figure 5J:
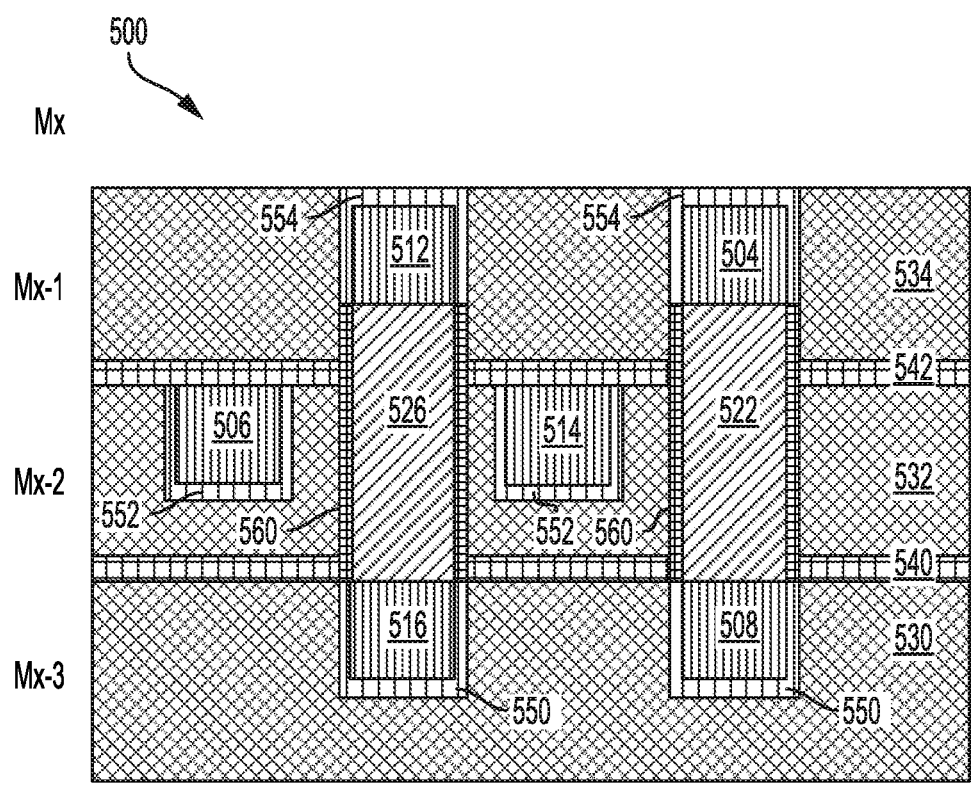

As illustrated in FIG. 5I, the TiN layer 580 is etched away through a hard mask removal process followed by a wet clean process. In FIG. 5J, a third barrier layer 554 is deposited on sidewalls of the deep trenches 594. A conductive metal (e.g., Cu, Co, Ru, etc.) may then be deposited on the super-vias 526, 522 to form a third set of conductive fingers 504 and a fourth set of conductive fingers 512. For example, the third set of conductive fingers 504 and the fourth set of conductive fingers 512 may be formed by Cu electroplating followed by a chemical mechanical planarization (CMP) process. According to aspects of the present disclosure, the third barrier layer 554 may also cover a top portion of the third set of conductive fingers 504 and the fourth set of conductive fingers 512.

Figure 5K:
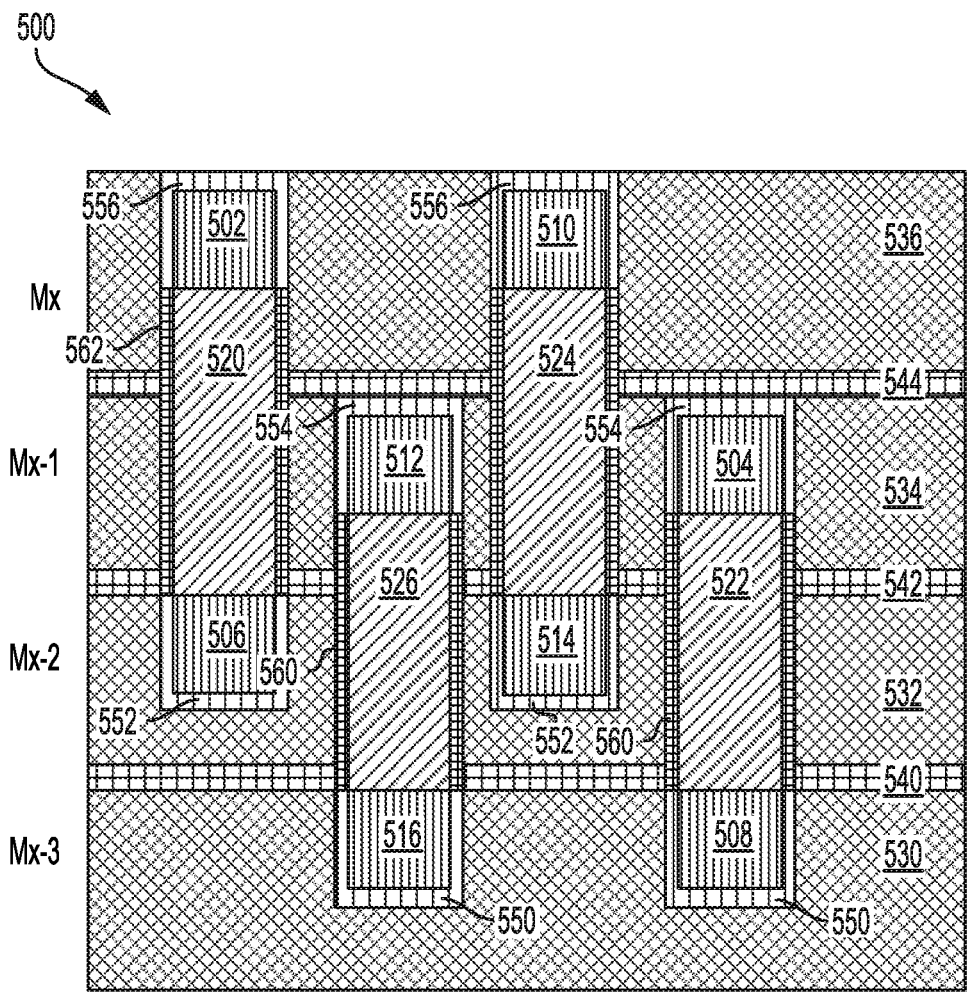

Finally, as shown in FIG. 5K, super-vias 520 and 524, as well as a first set of conductive fingers 502 and a second set of conductive fingers 510, may be formed by repeating the steps illustrated in FIGS. 5A through 5J. Similarly, the super-vias 520 and 524 may include an isolation dielectric layer 562 on its sidewalls, and the first set of conductive fingers 502 and the second set of conductive fingers 510 may include a fourth barrier layer 556. Additionally, the super-vias 520 and 524 may be formed by etching through a third separation layer 544 and a portion of a fourth dielectric layer 536. The first set of conductive fingers 502 and the second set of conductive fingers 510 may be formed in the fourth dielectric layer 536.

According to aspects of the present disclosure, the super-vias 520 and 524 may extend from the Mx interconnect level through the Mx-1 interconnect level. As described, the fabrication process includes only one additional mask per layer as compared to a conventional FMOM fabrication process.

Figure 6:
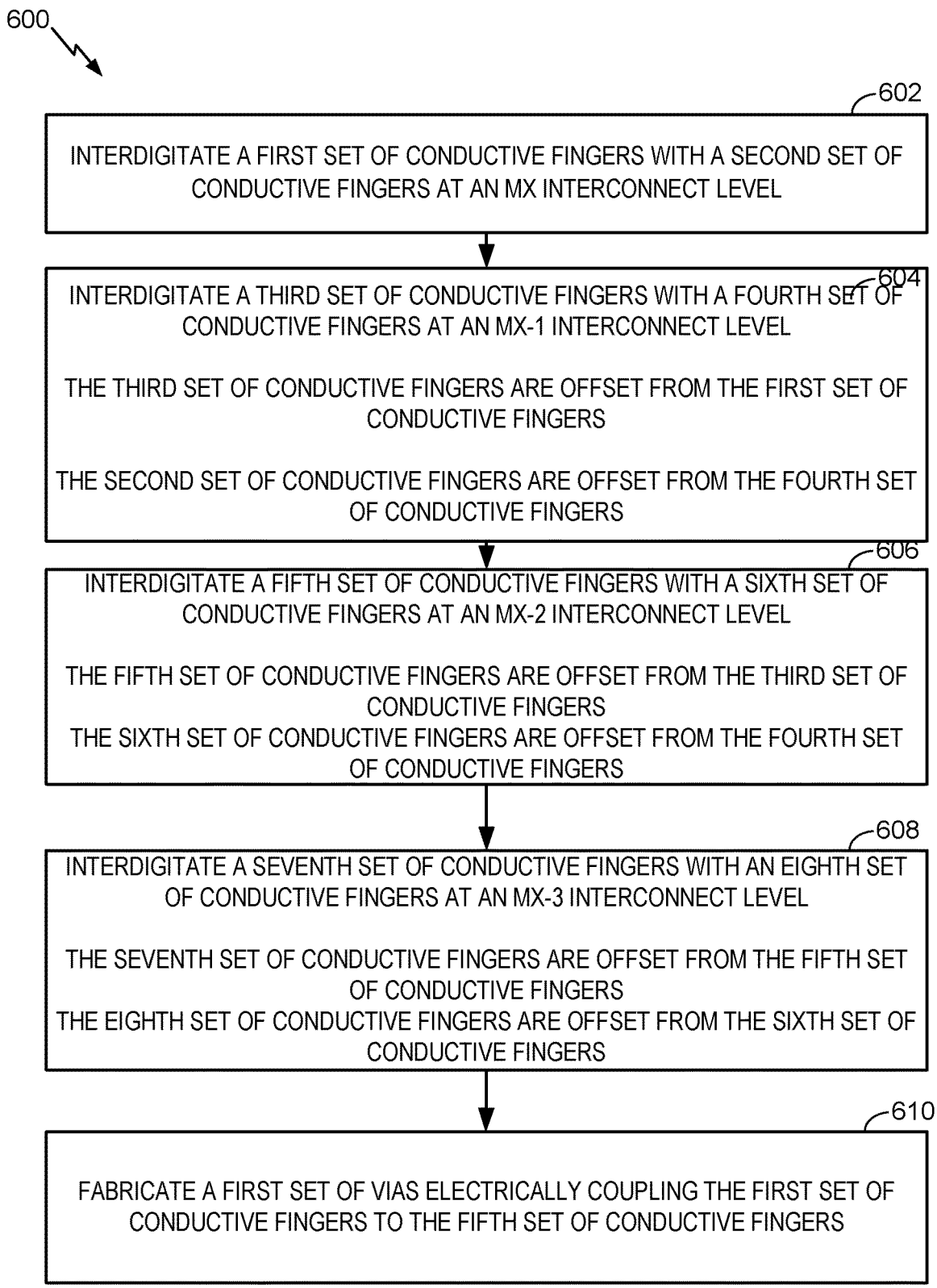
FIG. 6 is a process flow diagram illustrating a method for fabricating a finger metal-oxide-metal (FMOM) capacitor structure according to aspects of the present disclosure.

FIG. 6 is a process flow diagram illustrating a method of fabricating a capacitor 600 according to aspects of the present disclosure. At block 602, a first set of conductive fingers is interdigitated with a second set of conductive fingers at an Mx interconnect level. For example, the first set of conductive fingers 402 and the second set of conductive fingers 410 are interdigitated with each other, as shown in FIGS. 4A and 4B.

At block 604, a third set of conductive fingers is interdigitated with a fourth set of conductive fingers at an Mx-1 interconnect level. The third set of conductive fingers are offset from the first set of conductive fingers, and the second set of conductive fingers are offset from the fourth set of conductive fingers. For example, the third set of conductive fingers 404 and the fourth set of conductive fingers 412 are interdigitated with each other, and offset from the first set of conductive fingers 402 and the second set of conductive fingers 410, as shown in FIGS. 4A and 4B.

At block 606, a fifth set of conductive fingers is interdigitated with a sixth set of conductive fingers at an Mx-2 interconnect level. The fifth set of conductive fingers are offset from the third set of conductive fingers, and the sixth set of conductive fingers are offset from the fourth set of conductive fingers. For example, the fifth set of conductive fingers 406 and the sixth set of conductive fingers 414 are interdigitated with each other, and offset from the third set of conductive fingers 404 and the fourth set of conductive fingers 412, as shown in FIGS. 4A and 4B.

At block 608, a seventh set of conductive fingers is interdigitated with an eighth set of conductive fingers at an Mx-3 interconnect level. The seventh set of conductive fingers are offset from the fifth set of conductive fingers, and the eighth set of conductive fingers are offset from the sixth set of conductive fingers. For example, the seventh set of conductive fingers 408 and the eighth set of conductive fingers 416 are interdigitated with each other, and offset from the fifth set of conductive fingers 406 and the sixth set of conductive fingers 414, as shown in FIGS. 4A and 4B.

At block 610, a first set of vias is fabricated, such that the first set of vias electrically couples the first set of conductive fingers to the fifth set of conductive fingers. For example, the first set of vias 420 electrically couples the first set of conductive fingers 402 to the fifth set of conductive fingers 406, as shown in FIGS. 4A and 4B. According to aspects of the present disclosure, extreme ultraviolet (EUV) lithography may be used to control placement of vias.

According to a further aspect of the present disclosure, a finger metal-oxide-metal (FMOM) capacitor structure is described. The capacitor structure includes means for coupling. The coupling means may be the first set of vias 420 as shown in FIGS. 4A and 4B. In another aspect, the aforementioned means may be any structure or any material configured to perform the functions recited by the aforementioned means.

Figure 7:
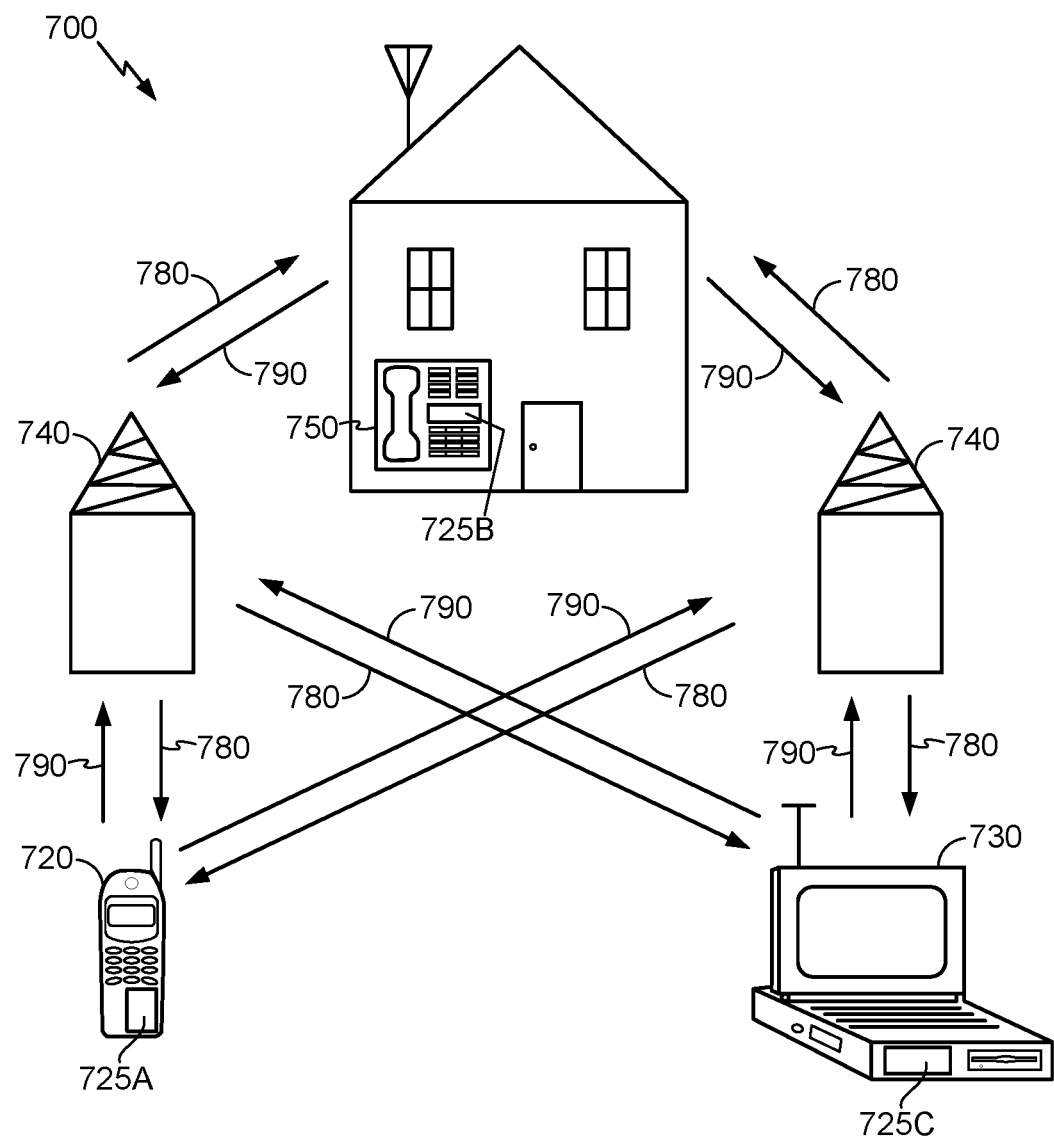
FIG. 7 is a block diagram showing an exemplary wireless communications system in which a configuration of the present disclosure may be advantageously employed.

FIG. 7 is a block diagram showing an exemplary wireless communications system 700 in which an aspect of the present disclosure may be advantageously employed. For purposes of illustration, FIG. 7 shows three remote units 720, 730, and 750 and two base stations 740. It will be recognized that wireless communications systems may have many more remote units and base stations. Remote units 720, 730, and 750 include IC devices 725A, 725C, and 725B that include the disclosed capacitor. It will be recognized that other devices may also include the disclosed capacitor, such as the base stations, switching devices, and network equipment. FIG. 7 shows forward link signals 780 from the base station 740 to the remote units 720, 730, and 750 and reverse link signals 790 from the remote units 720, 730, and 750 to base stations 740.

In FIG. 7, remote unit 720 is shown as a mobile telephone, remote unit 730 is shown as a portable computer, and remote unit 750 is shown as a fixed location remote unit in a wireless local loop system. For example, the remote units may be a mobile phone, a hand-held personal communications systems (PCS) unit, a portable data unit such as a personal digital assistant (PDA), a GPS enabled device, a navigation device, a set top box, a music player, a video player, an entertainment unit, a fixed location data unit such as meter reading equipment, or other devices that store or retrieve data or computer instructions, or combinations thereof. Although FIG. 7 illustrates remote units according to the aspects of the present disclosure, the present disclosure is not limited to these exemplary illustrated units. Aspects of the present disclosure may be suitably employed in many devices, which include the disclosed capacitor.

Figure 8:
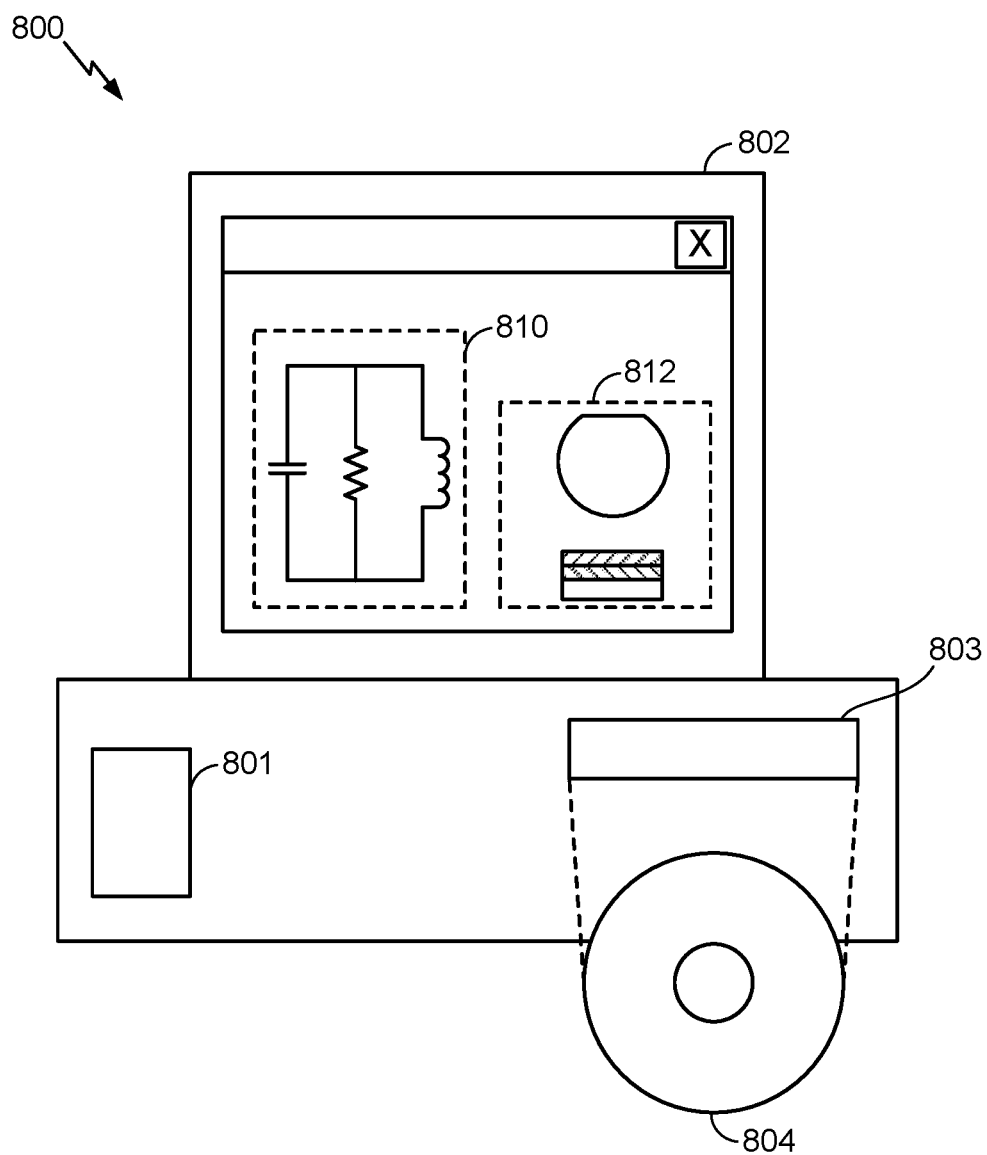
FIG. 8 is a block diagram illustrating a design workstation used for circuit, layout, and logic design of a finger metal-oxide-metal (FMOM) capacitor structure according to one configuration.

FIG. 8 is a block diagram illustrating a design workstation used for circuit, layout, and logic design of a semiconductor component, such as the capacitor disclosed above. A design workstation 800 includes a hard disk 801 containing operating system software, support files, and design software such as Cadence or OrCAD. The design workstation 800 also includes a display 802 to facilitate design of a circuit 810 or a semiconductor component 812 such as a capacitor. A storage medium 804 is provided for tangibly storing the design of the circuit 810 or the semiconductor component 812. The design of the circuit 810 or the semiconductor component 812 may be stored on the storage medium 804 in a file format such as GDSII or GERBER. The storage medium 804 may be a CD-ROM, DVD, hard disk, flash memory, or other appropriate device. Furthermore, the design workstation 800 includes a drive apparatus 803 for accepting input from or writing output to the storage medium 804.

Data recorded on the storage medium 804 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 804 facilitates the design of the circuit 810 or the semiconductor component 812 by decreasing the number of processes for designing semiconductor wafers.

For a firmware and/or software implementation, the methodologies may be implemented with modules (e.g., procedures, functions, and so on) that perform the functions described herein. A machine-readable medium tangibly embodying instructions may be used in implementing the methodologies described herein. For example, software codes may be stored in a memory and executed by a processor unit. Memory may be implemented within the processor unit or external to the processor unit. As used herein, the term "memory" refers to types of long term, short term, volatile, nonvolatile, or other memory and is not to be limited to a particular type of memory or number of memories, or type of media upon which memory is stored.

If implemented in firmware and/or software, the functions may be stored as one or more instructions or code on a non-transitory computer-readable medium. Examples include computer-readable media encoded with a data structure and computer-readable media encoded with a computer program. Computer-readable media includes physical computer storage media. A storage medium may be an available medium that can be accessed by a computer. By way of example, and not limitation, such computer-readable media can include RAM, ROM, EEPROM, CD-ROM or other optical disk storage, magnetic disk storage or other magnetic storage devices, or other medium that can be used to store desired program code in the form of instructions or data structures and that can be accessed by a computer; disk and disc, as used herein, includes compact disc (CD), laser disc, optical disc, digital versatile disc (DVD) and Blu-ray disc where disks usually reproduce data magnetically, while discs reproduce data optically with lasers. Combinations of the above should also be included within the scope of computer-readable media.

In addition to storage on computer-readable medium, instructions and/or data may be provided as signals on transmission media included in a communications apparatus. For example, a communications apparatus may include a transceiver having signals indicative of instructions and data. The instructions and data are configured to cause one or more processors to implement the functions outlined in the claims.

Although the present disclosure and its advantages have been described in detail, it should be understood that various changes, substitutions, and alterations can be made herein without departing from the technology of the present disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, and composition of matter, means, methods, and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the present disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the present disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communications media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. In addition, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), and Blu-ray disc where disks usually reproduce data magnetically, while discs reproduce data optically with lasers. Combinations of the above should also be included within the scope of computer-readable media.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language of the claims, wherein reference to an element in the singular is not intended to mean "one and only one" unless specifically so stated, but rather "one or more." Unless specifically stated otherwise, the term "some" refers to one or more. A phrase referring to "at least one of" a list of items refers to any combination of those items, including single members. As an example, "at least one of: a, b, or c" is intended to cover: a; b; c; a and b; a and c; b and c; and a, b and c. All structural and functional equivalents to the elements of the various aspects described throughout this present disclosure that are known or later come to be known to those of ordinary skill in the art are expressly incorporated herein by reference and are intended to be encompassed by the claims. Moreover, nothing disclosed herein is intended to be dedicated to the public regardless of whether such present disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "a step for."

What is claimed is:

1. A capacitor, comprising:
   a first set of conductive fingers interdigitated with a second set of conductive fingers at an Mx interconnect level;
   a third set of conductive fingers interdigitated with a fourth set of conductive fingers at an Mx-1 interconnect level, the third set of conductive fingers offset from and parallel to the first set of conductive fingers, the second set of conductive fingers offset from and parallel to the fourth set of conductive fingers;
   a fifth set of conductive fingers interdigitated with a sixth set of conductive fingers at an Mx-2 interconnect level, the fifth set of conductive fingers offset from and parallel to the third set of conductive fingers, the sixth set of conductive fingers offset from and parallel to the fourth set of conductive fingers;
   a seventh set of conductive fingers interdigitated with an eighth set of conductive fingers at an Mx-3 interconnect level, the seventh set of conductive fingers offset from and parallel to the fifth set of conductive fingers, the eighth set of conductive fingers offset from and parallel to the sixth set of conductive fingers; and
   a first set of vias electrically coupling the first set of conductive fingers to the fifth set of conductive fingers, the first set of vias not coupled to any conductive fingers in interconnect level Mx-1.

2. The capacitor of claim 1, in which the first set of vias are super-vias.

3. The capacitor of claim 1, in which the conductive fingers are staggered.

4. The capacitor of claim 1, in which a pitch between the conductive fingers varies within a same interconnect level.

5. The capacitor of claim 1, further comprising a second set of vias electrically coupling the third set of conductive fingers to the seventh set of conductive fingers, the second set of vias not coupled to the fifth set of conductive fingers.

6. The capacitor of claim 5, in which the first set of vias is offset from the second set of vias.

7. The capacitor of claim 5, in which the first set of vias is aligned with the second set of vias.

8. The capacitor of claim 1, integrated into at least one of a music player, a video player, an entertainment unit, a navigation device, a communications device, a personal digital assistant (PDA), a fixed location data unit, a mobile phone, and a portable computer.

9. A capacitor, comprising:
   a first set of conductive fingers interdigitated with a second set of conductive fingers at an Mx interconnect level;
   a third set of conductive fingers interdigitated with a fourth set of conductive fingers at an Mx-1 interconnect level, the third set of conductive fingers offset from and parallel to the first set of conductive fingers, the second set of conductive fingers offset from and parallel to the fourth set of conductive fingers;

a fifth set of conductive fingers interdigitated with a sixth set of conductive fingers at an Mx-2 interconnect level, the fifth set of conductive fingers offset from and parallel to the third set of conductive fingers, the sixth set of conductive fingers offset from and parallel to the fourth set of conductive fingers;

a seventh set of conductive fingers interdigitated with an eighth set of conductive fingers at an Mx-3 interconnect level, the seventh set of conductive fingers offset from and parallel to the fifth set of conductive fingers, the eighth set of conductive fingers offset from and parallel to the sixth set of conductive fingers; and means for coupling the first set of conductive fingers to the fifth set of conductive fingers, the means for coupling not coupled to any conductive fingers in interconnect level Mx-1.

10. The capacitor of claim 9, in which the conductive fingers are staggered.

11. The capacitor of claim 9, integrated into at least one of a music player, a video player, an entertainment unit, a navigation device, a communications device, a personal digital assistant (PDA), a fixed location data unit, a mobile phone, and a portable computer.

\* \* \* \* \*